(12) United States Patent
Oyamada et al.

(10) Patent No.: US 10,985,130 B2
(45) Date of Patent: Apr. 20, 2021

(54) CU ALLOY BONDING WIRE FOR SEMICONDUCTOR DEVICE

(71) Applicants: NIPPON STEEL CHEMICAL & MATERIAL CO., LTD., Tokyo (JP); NIPPON MICROMETAL CORPORATION, Saitama (JP)

(72) Inventors: Tetsuya Oyamada, Tokyo (JP); Tomohiro Uno, Tokyo (JP); Takashi Yamada, Saitama (JP); Daizo Oda, Saitama (JP)

(73) Assignees: NIPPON STEEL CHEMICAL & MATERIAL CO., LTD., Tokyo (JP); NIPPON MICROMETAL CORPORATION, Saitama (JP)

( * ) Notice: Subject to any disclaimer, the term of this patent is extended or adjusted under 35 U.S.C. 154(b) by 0 days.

(21) Appl. No.: 16/976,069
(22) PCT Filed: Sep. 20, 2019
(86) PCT No.: PCT/JP2019/037023
§ 371 (c)(1),
(2) Date: Aug. 26, 2020
(87) PCT Pub. No.: WO2020/059856
PCT Pub. Date: Mar. 26, 2020

(65) Prior Publication Data
US 2021/0043599 A1 Feb. 11, 2021

(30) Foreign Application Priority Data
Sep. 21, 2018 (JP) .............................. JP2018-177261

(51) Int. Cl.
| | |
|---|---|
| H01L 23/00 | (2006.01) |
| C22C 9/00 | (2006.01) |
| H01L 23/49 | (2006.01) |

(52) U.S. Cl.
CPC ................ H01L 24/45 (2013.01); C22C 9/00 (2013.01); H01L 23/49 (2013.01);
(Continued)

(58) Field of Classification Search
CPC ............ H01L 24/45; H01L 2224/45147; H01L 23/49; C22C 9/00
See application file for complete search history.

(56) References Cited

U.S. PATENT DOCUMENTS

2005/0079347 A1* 4/2005 Uno .......................... C22C 5/02
428/364
2012/0118610 A1 5/2012 Terashima et al.
(Continued)

FOREIGN PATENT DOCUMENTS

| | | |
|---|---|---|
| JP | 2004-228541 A | 8/2004 |
| JP | 2011-035020 A | 2/2011 |

(Continued)

OTHER PUBLICATIONS

Decision to Grant a Patent issued in corresponding Japanese Patent Application No. 2019-563915, dated Dec. 24, 2019, with English translation.
(Continued)

*Primary Examiner* — David A Zarneke
(74) *Attorney, Agent, or Firm* — McDermott Will & Emery LLP

(57) ABSTRACT

It is an object to provide a Cu alloy bonding wire for a semiconductor device that can satisfy required performance in high-density LSI applications. In the Cu alloy bonding wire for a semiconductor device according to the present invention, each of abundance ratios of crystal orientations <100>, <110> and <111> having an angular difference of 15 degrees or less from a direction perpendicular to one plane including a wire center axis out of crystal orientations on a wire surface is 3% or more and less than 27% in average area percentage.

8 Claims, 3 Drawing Sheets

(52) U.S. Cl.
CPC ............... *H01L 2224/45105* (2013.01); *H01L 2224/45109* (2013.01); *H01L 2224/45139* (2013.01); *H01L 2224/45144* (2013.01); *H01L 2224/45147* (2013.01); *H01L 2224/45155* (2013.01); *H01L 2224/45164* (2013.01); *H01L 2224/45169* (2013.01); *H01L 2924/01015* (2013.01); *H01L 2924/01032* (2013.01)

(56) References Cited

U.S. PATENT DOCUMENTS

| | | | | |
|---|---|---|---|---|
| 2013/0213536 | A1* | 8/2013 | Yamashita | H01B 13/0016 148/678 |
| 2014/0302342 | A1* | 10/2014 | Aoyama | C22F 1/08 428/639 |
| 2016/0111389 | A1 | 4/2016 | Yamada et al. | |
| 2018/0019559 | A1* | 1/2018 | Matsuo | C22C 9/02 |
| 2020/0173048 | A1* | 6/2020 | Tarutani | C25C 1/12 |

FOREIGN PATENT DOCUMENTS

| | | |
|---|---|---|
| JP | 2011091404 A | 5/2011 |
| JP | WO2009093554 A1 | 5/2011 |
| JP | 2019-504472 A | 2/2019 |
| WO | 2015152191 A1 | 10/2015 |
| WO | 2017221434 A1 | 12/2017 |

OTHER PUBLICATIONS

International Search Report issued in corresponding International Patent Application No. PCT/JP2019/037023, dated Nov. 5, 2019, with English translation.

* cited by examiner

CU ALLOY BONDING WIRE FOR SEMICONDUCTOR DEVICE

CROSS-REFERENCE OF RELATED APPLICATIONS

This application is the U.S. National Phase under 35 U.S.C. § 371 of International Patent Application No. PCT/JP2019/037023, filed on Sep. 20, 2019, which in turn claims the benefit of Japanese Application No. 2018-177261, filed on Sep. 21, 2018, the entire disclosures of which Applications are incorporated by reference herein.

TECHNICAL FIELD

The present invention relates to a Cu alloy bonding wire for a semiconductor device, where the Cu alloy bonding wire is used to connect electrodes on semiconductor elements with a circuit wiring board such as external leads.

BACKGROUND ART

Currently, as bonding wires for semiconductor device (hereinafter referred to as bonding wires) for use to bond electrodes on semiconductor elements with external leads, fine wires approximately 15 to 50 µm in diameter are mainly used. As a method for bonding the bonding wires, a thermosonic bonding process is used commonly, and a general-purpose bonding machine, a capillary jig, and the like are used, where the capillary jig is used for connection while passing the bonding wire therethrough. A bonding process for a bonding wire involves heat-melting a wire tip by arc heat input, forming a ball (FAB: Free Air Ball) by surface tension, pressure-bonding a ball portion (hereinafter referred to as ball bonding) to an electrode of a semiconductor element heated in a range of 150 to 300° C., forming a loop while drawing out a wire from a capillary, and then pressure-bonding a wire portion to an electrode on an external lead side (hereinafter referred to as wedge bonding) to complete the process.

As a bonding wire material, gold (Au) has mainly been used heretofore, but the alternative to copper (Cu) has progressed recently. Bonding wires made of Cu are roughly classified into bonding wires each having a coating layer of Pd, Au, or the like on the surface of Cu (hereinafter referred to as coated Cu wires) and bonding wires each having no coating layer (hereinafter referred to as bare Cu wires). The coated Cu wires are characterized in that the coating layer is provided to suppress the oxidation of Cu and improve the use performance such as bondability, and are mainly used for high density LSIs. On the other hand, bare Cu wires are used mainly for applications of power devices having relatively low required performance by making the most of an advantage that they are inexpensive. Recently, attempts have been made to apply bare Cu wires to most advanced high-density LSIs by improving the characteristics of the bare Cu wires.

However, there has been a problem to be solved in order to apply the bare Cu wires to the most advanced high-density LSIs. The problem is straightness of loops. In high-density LSIs, miniaturization and pitch reduction electrodes have been progressing along with an increase in packaging density. In order to cope with such an increase in packaging density, a technique for wiring bonding wires at short intervals has been required. At this time, if a loop portion is inclined or bent, adjacent wires come into contact with each other, and a defect such as a short-circuit occurs. Therefore, bonding wires used for a high-density LSI are required to have high straightness of loops. In the case of the bare Cu wires, the output of ultrasonic waves tends to be high in order to obtain the bonding strength of wedge bond areas. In this case, the loop may be bent due to the influence of the ultrasonic waves. In the wedge bonding of bare Cu wires, an operation called a scrub, which vibrates a stage at a low frequency, is often used together while the wire is pressed by a capillary. The scrub promotes the deformation of the wire and is effective for improving the bonding strength of the wedge bond areas. However, the vibration of the scrub has caused bending of the loop and deterioration of the straightness in some cases. Furthermore, a small wire diameter of 25 µm or less has been mainly adopted as the diameters of bonding wires used in high-density LSIs. However, as the wire diameter becomes smaller, the strength of the loop portion becomes lower, so that it has been more difficult to secure the straightness of loops.

Patent Literature 1 discloses a bonding wire for a semiconductor device having a core material made of a conductive metal, and a skin layer mainly composed of a metal different from that of the core material on the core material, the bonding wire being characterized in that the aspect ratio of the average size of crystal grains on the surface of the skin layer in the wire longitudinal direction/wire circumferential direction is 3 or more, and describes that the straightness of loops is good in a 3 mm span under a normal condition.

Patent Literature 2 discloses a bonding wire for a semiconductor device having a core material made of a conductive metal and a skin layer mainly composed of a metal different from that of the core material on the core material, the bonding wire being characterized in that the relationship between the average size "a" of crystal grains of the skin layer in a wire circumferential direction on the wire surface and the average size "b" of crystal grains of the core material in a vertical section that is a section in a direction perpendicular to a wire axis satisfies a/b≤0.7, and describes that wire tilting (leaning property) right above a ball can be improved.

CITATION LIST

Patent Literature

Patent Literature 1: Japanese Patent Laid-Open No. 2011-91404
Patent Literature 2: International Publication No. WO2009/093554

SUMMARY OF INVENTION

Technical Problem

FIG. 1 schematically shows a case where the straightness of loops is high, and FIGS. 2A and 2B schematically show a case where the straightness of loops is low. In this schematic diagram, a loop portion is observed from immediately above. A loop 1 having high straightness of loops has neither an inclination nor a bend at the loop portion, and has a linear shape or a shape close to a straight line. On the other hand, when the straightness of loops is low, for example, the loop often has such a shape that the loop is inclined as a whole in one direction like a loop 2 or a part of the loop is curved right and left like a loop 3.

Patent Literatures 1 and 2 are a technique relating to a bonding wire for a semiconductor device having a core material made of a conductive metal, and a skin layer mainly composed of a metal different from that of the core material on the core material. This technique is premised on a coating structure, and it has been unclear whether this technique is effective to bare Cu wires. Therefore, the inventors investigated whether the straightness of loops of the bare Cu wires could be improved by using these techniques for the bare Cu wires and the straightness of loops required for high-density LSIs could be satisfied.

In consideration of Patent Literature 1, a verification was made as to whether the straightness of loops could be improved by setting the aspect ratio of the average size of crystal grains on the surface of a bare Cu wire in the wire longitudinal direction/the wire circumferential direction to 3 or more. Prototype bare Cu wires in which the aspect ratio of the average size of crystal grains on the wire surface in the wire longitudinal direction/the wire circumferential direction was 3 or more were produced, and the straightness of loops thereof was evaluated. An evaluation result indicated that the prototype bare Cu wires could not satisfy the straightness of loops required for high-density LSIs. From this result, it has been clarified that it is impossible to satisfy the straightness of loops required for high-density LSIs even if the average size of crystal grain sizes on the surface of the bare Cu wire is controlled in consideration of the technique disclosed in Patent Literature 1.

In consideration of Patent Literature 2, a verification was made as to whether the straightness of loops could be improved when the relationship between the average size "a" in the wire circumferential direction of crystal grains on the surface of the bare Cu wire and the average size "b" of crystal grains in a vertical section which was a section in a direction perpendicular to a wire axis satisfied a/b≤0.7. Prototype bare Cu wires in which the relationship between the average size "a" of the crystal grains in the wire circumferential direction on the wire surface and the average size "b" of the crystal grains in the vertical section in a direction perpendicular to the wire axis satisfies a/b≤0.7 were produced, and the straightness of loops thereof was evaluated. An evaluation result indicated that the prototype bare Cu wires could not satisfy the straightness of loops required for high-density LSIs. From this result, it has been clarified that it is impossible to satisfy the straightness of loops required for high-density LSIs even if the average size of crystal grains on the surface of the bare Cu wire is controlled in consideration of the technique disclosed in Patent Literature 2.

As described above, even when the techniques disclosed in Patent Literatures 1 and 2 are considered and applied to bare Cu wires, it has been impossible to satisfy the straightness of loops required for application to the most advanced high-density LSIs.

After semiconductor elements and a wiring board are connected to each other with bonding wires, the surroundings are sealed with resin to protect them from shock, temperature, humidity, and the like. Transfer molding using a thermosetting resin such as an epoxy-based resin is mainly used as a resin sealing method. In the transfer molding, first, a thermosetting resin is charged into a mold which has been heated to 160 to 190° C., thereby reducing the viscosity of the thermosetting resin. Thereafter, the resin is poured into a mold to which a lead frame and a resin substrate are fixed, and molded into a desired shape. Further, the resin is heated in the mold for several minutes, and finally cured, thereby completing the molding. A problem in a resin sealing step in a high-density LSI resides in deformation of a loop portion when resin is poured into a mold. In the transfer molding, since a resin flows along the surface of a substrate, the resin comes into contact with the loop portion, and the loop portion is deformed, so that the straightness of loops tends to be lost. As described above, in order to apply the bare Cu wire to the most advanced high-density LSI, there has been required a technique in which deformation of the loop portion is suppressed as much as possible in the resin sealing step to maintain high straightness of loops.

A bent portion immediately above a ball in loop portions is called a neck portion. Since the neck portion suffers a large bending deformation as compared with the other loop portions, there is a problem that the neck portion cannot withstand the bending deformation and thus damage such as a crack occurs. In order to apply bare Cu wires to the most advanced high-density LSIs, a technique for reducing damage to the neck portion has been required.

In the most advanced high-density LSIs, it has been required to make the loop height lower (lower the loop) as semiconductor products are thinned. In order to lower the loop, it is necessary to bend the neck portion more greatly than before. At this time, a larger load is imposed on the neck portion than that in the case of a normal loop height, so that there has been a problem that the neck portion is more likely to be damaged. Therefore, in order to apply bare Cu wires to the most advanced high-density LSIs, a technique for reducing damage to the neck portion even when the loop is lowered has been required.

The most advanced high-density LSIs are required to operate without occurrence of any failure even when used for a long time. In response to such a requirement, it has been required to make an improvement in the long-term service life of each bonding portion of the bonding wire. A high-temperature storage test, a high-temperature and high-humidity test, a heat cycle test, and the like are generally performed as a method of evaluating the long-term service life. In the most advanced high-density LSIs, a performance requirement which is particularly required for the high-temperature storage test is severe, and it has been required that a long-term service life of 500 hours or more is satisfied in a high-temperature storage test at 200° C. When the bare Cu wires are used, there has been a problem that separation occurs between a ball and an Al electrode as a bonding partner at a ball bond area, and electrical connection is lost. Such separation has occurred in less than 500 hours, and thus the bare Cu wires have been incapable of satisfying the performance required for the most advanced high-density LSIs. Therefore, in order to apply the bare Cu wires to the most advanced high-density LSIs, a technique for improving the life of ball bond areas (hereinafter, ball bond area life) in the high-temperature storage test has been required.

Miniaturization of electrodes on semiconductor elements has progressed in the most advanced high-density LSIs. In order to cope with such miniaturization of the electrodes, a technique for controlling a ball deformation behavior when ball bonding is performed has been required. A problem in the case of the bare Cu wires resides in a defect in which the shape of a crimped ball (hereinafter, referred to as crimped ball shape) is deformed into a petal-like shape when ball bonding is performed. When such a defect occurs, a part of the deformed ball protrudes out of an electrode and comes into contact with an adjacent electrode to cause a short circuit or the like. Therefore, in order to apply the bare Cu wires to the most advanced high-density LSIs, there has been required a technique for controlling the crimped ball shape so that the crimped ball shape looks like a shape close to a perfect circle when it is observed from immediately above the electrode.

The present invention has an object to provide a Cu alloy bonding wire for a semiconductor device that can satisfy required performance in an application to high-density LSIs.

Solution to Problem

In a Cu alloy bonding wire for a semiconductor device according to the present invention, each of the abundance ratios of crystal orientations <100>, <110> and <111> having an angular difference of 15 degrees or less from a direction perpendicular to one plane including a wire center axis out of crystal orientations on a wire surface is 3% or more and less than 27% in average area percentage.

Advantageous Effect of Invention

According to the present invention, since the straightness of loops can be improved, the performance required for an application to high-density LSIs can be satisfied.

BRIEF DESCRIPTION OF DRAWINGS

FIG. 2 is a schematic view of a loop portion in the case of low straightness of loops when the loop portion is viewed from immediately above, wherein

DESCRIPTION OF EMBODIMENTS

A bonding wire of the present embodiment is a Cu alloy bonding wire for a semiconductor device, wherein each of abundance ratios of crystal orientations <100>, <110> and <111> having an angular difference of 15 degrees or less from a direction perpendicular to one plane including a wire center axis out of crystal orientations on a wire surface is 3% or more and less than 27% in average area percentage.

(Method for Determining Crystal Orientation on Bonding Wire Surface)

A method for measuring crystal orientations on a bonding wire surface in the present specification will be described. The crystal orientation on a wire surface is defined herein as a crystal orientation of Cu and an alloy part mainly composed of Cu existing on the wire surface. The crystal orientations on the wire surface can be measured by using an electron backscattered diffraction (EBSD) method installed in SEM. The EBSD method is a method for projecting, to a detector surface, a diffraction pattern of reflected electrons generated when a sample is irradiated with an electron beam, and analyzing the diffraction pattern to determine crystal orientations at individual measurement points. Dedicated software (OIM analysis produced by TSL Solutions or the like) is usable for analyzing data obtained by the EBSD method. According to the present embodiment, a bonding wire is fixed onto a sample stage, the wire surface is irradiated with an electron beam from one direction to obtain data on crystal orientations. By using this method, a crystal orientation with respect to a direction perpendicular to one plane including the wire center axis and a crystal orientation with respect to a direction of the wire center axis out of crystal orientations on the wire surface can be determined.

As an example, description will be given of a method for calculating the abundance ratio of a crystal orientation <100> with respect to a direction perpendicular to one plane including the wire center axis to the crystal orientations on the wire surface. The abundance ratio of the crystal orientation <100> is defined to be a ratio of the area occupied by the crystal orientation <100> determined by the above method to the area of a measurement region for the EBSD method.

Figure 1:
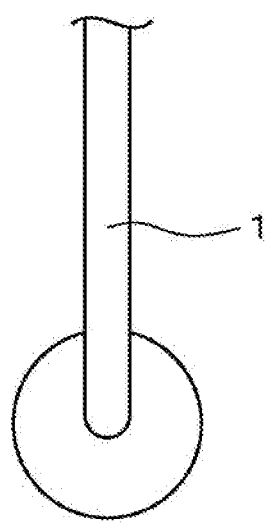
FIG. 1 is a schematic view of a loop portion in the case of high straightness of loops when the loop portion is viewed from immediately above.
Figure 2A:
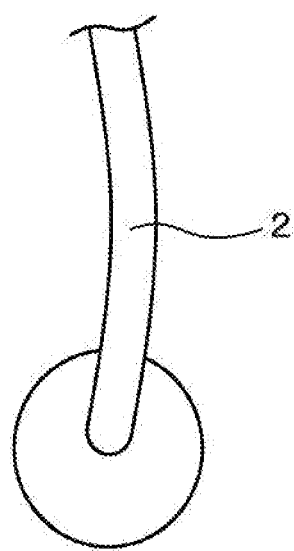
FIG. 2A illustrates a state where the loop portion is bent in one direction.
Figure 2B:
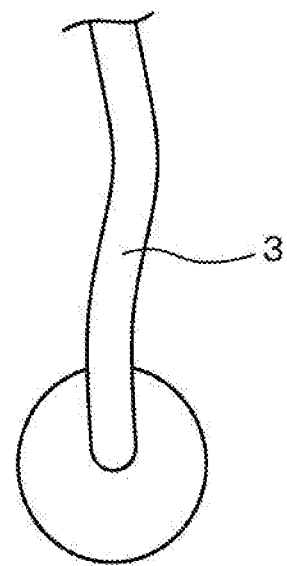
FIG. 2B illustrates a state where the loop portion is bent right and left.
Figure 3:
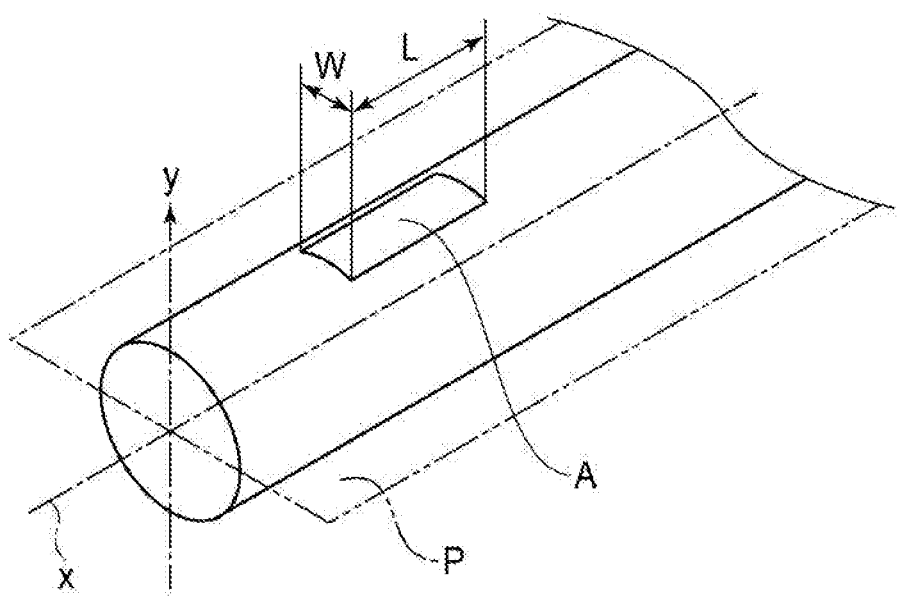
FIG. 3 is a perspective view showing a measurement region.

As shown in FIG. 3, the crystal orientation <100> is defined herein to be a crystal orientation having an angular difference of 15 degrees or less from a direction y perpendicular to one plane P including a wire center axis x out of crystal orientations <100> on the wire surface. This is because an advantageous effect for improvement of bonding wire characteristics can be obtained if the angular difference is 15 degrees or less. Abundance ratios of crystal orientations <110> and <111> with respect to the direction of the wire center axis x out of the crystal orientations on the wire surface of the bonding wire can be also calculated by using a similar method.

An average area percentage is used herein as a value of the abundance ratio of a specific crystal orientation. The average area percentage is an arithmetic mean of respective values of abundance ratios obtained by measuring at least ten or more points by the EBSD method. In selecting the measurement points, preferably the objectivity of measurement data is ensured. As a method therefor, preferably measurement samples are taken from the bonding wire to be measured, at intervals of 3 to 5 m along the direction of the wire center axis x of the bonding wire and used for measurement. On an SEM image, preferably a measurement region A has a length W of 25% or less the wire diameter in a circumference direction, and a length L of 40 μm to 100 μm in the direction of the wire center axis x.

It was confirmed that the abundance ratios of the crystal orientations on the wire surface measured by the EBSD method had a strong correlation with an improvement effect on the straightness of loops which is a working effect of the present embodiment. Here, the wire surface is a curved surface, and deviates from the orientation perpendicular to the wire surface with increasing distance in a circumferential direction from a peak (the highest point of the wire fixed onto the sample stage with respect to the circumferential direction) of the wire, but it can be said that the measurement data taken by the above method is consistent with the actual conditions indicating the improvement effect on the straightness of loops. This is because when the length W of the measurement region A is 25% or less the wire diameter, in the EBSD measurement region of the wire surface having a curved surface, the deviation of the orientation perpendicular to the wire surface from the circumferential direction is permissible and the improvement effect on the straightness of loops can be obtained. The reason why a lower limit is placed on the measurement region A in the direction of the wire center axis x is that it was judged that measurement data reflected characteristics of the sample sufficiently if the length L was 40 μm or more. The reason why an upper limit is placed on the measurement region A in the direction of the wire center axis x is that analysis can be conducted efficiently if the length L is 100 μm or less.

There may be a copper oxide film and impurities which have been unintentionally attached to the surface of the bonding wire. Examples of the impurities include organic matter, sulfur, nitrogen, and compounds thereof. Even if such impurities exist, if the thickness of impurities is small or the abundance thereof is low, by optimizing measurement conditions of the EBSD method, the crystal orientations on the bonding wire surface can be measured. If there is a thick copper oxide film or a large deposit of impurities on the bonding wire surface, it may be impossible to measure crystal orientations in Cu or in a Cu alloy part. In that case, it is useful to treat the bonding wire surface by alkaline degreasing, acid washing, ion sputtering, or the like before measurements are taken by using the EBSD method.

(Method for Measuring Average Crystal Grain Size in a Section Perpendicular to Wire Center Axis of Bonding Wire)

A method for measuring the average crystal grain size in a section perpendicular to the wire center axis of the bonding wire will be described herein. The EBSD method can be used for measuring the average crystal grain size. The crystal grain size is defined to be a circle-equivalent diameter calculated from the area of a region surrounded by crystal grain boundaries in which the angular difference measured by the EBSD method is 15 degrees or more. As the average crystal grain size is used an arithmetic average value of crystal grain size values measured for five randomly extracted bonding wires. A method for embedding a bonding wire in resin and then mechanically polishing it or a method for performing processing with an Ar ion beam can be used as a method for exposing a section perpendicular to the wire center axis.

(Method for Analyzing Concentration of Elements Contained in Bonding Wire)

An ICP optical emission spectrometer can be used to analyze the concentration of elements contained in the bonding wire. When the concentration of contaminants such as carbon and sulfur on the surface of the bonding wire is high, the concentration analysis may be performed after a region of 1 to 2 nm from the surface of the bonding wire is removed by sputtering or the like before performing the analysis. A method using acid cleaning is also effective as another method.

(Improvement Effect on Straightness of Loops)

As a result of investigation of a control factor of the straightness of loops, the inventors have noted a correlation with the crystal orientation on the wire surface. Specifically, when a specific crystal orientation is strongly oriented on the wire surface, the entire loop is inclined in a specific direction or a part of the loop is bent. This is considered to be because the plastic anisotropy of the wire surface is magnified, and thus when a load is applied to a loop portion, the loop portion is easily deformed in a specific direction or the like. Based on this estimated deterioration mechanism of the straightness of loops, the inventors have intensively studied a method for improving the straightness of loops. As a result, the inventors have found that there is a strong correlation between the straightness of loops and the abundance ratios of the crystal orientations <100>, <110> and <111> having an angular difference of 15 degrees or less from a direction perpendicular to one plane including the wire center axis out of the crystal orientations on the wire surface, and an effect of improving the straightness of loops is obtained by controlling the abundance ratios of these crystal orientations to be in an appropriate range. Specifically, bonding was performed 100 times by using the bonding wire of the present embodiment, and from an observation result of the loop by an optical microscope, it was confirmed that places where the entire loop was inclined or a part of the loop was curved was significantly reduced, and high straightness of loops was obtained.

When the abundance ratio of one or more crystal orientations out of the abundance ratios of the crystal orientations <100>, <110> and <111> is less than 5% or 25% or more in average area percentage, the loop may be inclined in a specific direction. When the abundance ratio is less than 3% or 27% or more in average area percentage, the loop is inclined in a specific direction, and the improvement effect of the straightness of loops is insufficient, so that this condition is not suitable for practical use. The reason for this is considered to be caused by the fact that a certain crystal orientation out of the foregoing crystal orientations is strongly oriented, so that the plastic anisotropy on the wire surface at the loop portion is magnified.

(Improvement of Effect of Maintaining High Straightness of Loops Even After Resin Sealing)

It is further preferable in the bonding wire of the present embodiment that the total of the abundance ratios of the crystal orientations <100>, <110> and <111> having the angular difference of 15 degrees or less from a direction perpendicular to one plane including the wire center axis out of the crystal orientations on the wire surface is 15% or more and less than 50%. As a result, an effect of maintaining high straightness of loops even after the resin sealing step has been completed is obtained. Specifically, the bonding wires were bonded and then sealed with resin by transfer molding, and the loop was observed by using a soft X-ray apparatus. From an observation result of the loop, it was confirmed that high straightness of loops was maintained. This is considered to be because the effect of lessening the plastic anisotropy of the loop portion can be synergistically enhanced and thus the effect of maintaining high straightness of loops even after the resin sealing step is enhanced by setting each of the abundance ratios of the crystal orientations <100>, <110>, and <111> having the angular difference of 15 degrees or less from a direction perpendicular to one plane including the wire center axis out of the crystal orientations on the wire surface to 3% or more and less than 27% in average area percentage, and additionally controlling the total of the abundance ratios of these crystal orientations to be in an appropriate range.

When the total of the abundance ratios was less than 15% or 50% or more, the effect of maintaining high straightness of loops after resin sealing was not sufficient. When the total of the abundance ratios is less than 15%, the crystal orientations other than the crystal orientations <100>, <110>, and <111> may grow preferentially. Therefore, it is considered that the effect of maintaining high straightness of loops even after resin sealing could not be stably enhanced. When the total of the abundance ratios is 50% or more, the crystal orientations <100>, <110>, and <111> are dominant, and thus it is considered that the effect of maintaining high straightness of loops even after resin sealing could not be sufficiently enhanced.

(Improvement of Achieving Great Effect of Maintaining High Straightness of Loops Even After Resin Sealing)

It is further preferable in the bonding wire of the present embodiment to satisfy X+Y>Z when the abundance ratios of the crystal orientations <100>, <110> and <111> having an angular difference of 15 degrees or less from a direction perpendicular to one plane including the wire center axis out of the crystal orientations on the wire surface are represented by X, Y and Z, respectively. As a result, the effect of maintaining high straightness of loops even after resin sealing is further enhanced. It is estimated as the reason for this that the plastic anisotropy of the loop portion can be further lessened by setting each of the abundance ratios of the crystal orientations <100>, <110>, and <111> having the angular difference of 15 degrees or less from a direction perpendicular to one plane including the wire center axis out of the crystal orientations on the wire surface to 3% or more and less than 27% in average area percentage, setting the total of the abundance ratios of these crystal orientations to 15% or more and less than 50%, and additionally causing X, Y, and Z to satisfy the relationship of X+Y>Z, so that the effect of improving the straightness of loops is synergistically enhanced. A reason for this is not clear, but it is considered to be that the total abundance ratio of the crystal orientations <110> and <110> has a higher effect of lessening the plastic anisotropy of the loop portion as compared with the abundance ratio of the crystal orientation <111>.

When X, Y, and Z satisfy X+Y≤Z, it is rare that the effect of maintaining high straightness of loops even after resin sealing is further enhanced.

(Improvement of Achieving Greater Effect of Maintaining High Straightness of Loops Even After Resin Sealing)

It is further preferable in the bonding wire of the present embodiment that each of the abundance ratios of a crystal orientations <121> and <123> having an angular difference of 15 degrees or less from a direction perpendicular to one plane including the wire center axis out of the crystal orientations on the wire surface is less than 15% in average area percentage. As a result, the effect of maintaining high straightness of loops even after resin sealing is further enhanced. It is estimated as the reason for this that the plastic anisotropy of the loop portion can be further lessened by setting each of the abundance ratios of the crystal orientations <100>, <110>, and <111> having the angular difference of 15 degrees or less from a direction perpendicular to one plane including the wire center axis out of the crystal orientations on the wire surface to 3% or more and less than 27% in average area percentage, setting the total of the abundance ratios of these crystal orientations to 15% or more and less than 50%, causing X, Y, and Z to satisfy the relationship of X+Y>Z, and additionally setting each of the abundance ratios of the crystal orientations <121> and <123> to less than 15%, so that the effect of maintaining the straightness of loops even after resin sealing is synergistically enhanced.

When the abundance ratios of the crystal orientations <121> and <123> are 15% or more, the effect of further lessening the plastic anisotropy of the loop portion is insufficient, and an effect of more greatly enhancing the effect of maintaining high straightness of loops even after the resin sealing step has been completed is insufficient.

(Reduction of Damage of Neck Portion)

It is further preferable in the bonding wire of the present embodiment that the average crystal grain size in a section perpendicular to the wire center axis is 0.4 µm or more and 2.1 µm or less. As a result, damage to a neck portion can be reduced. This is considered to be because the average crystal grain size was set to 0.4 µm or more and 2.1 µm or less, whereby plastic deformability against bending deformation causing damage to the neck portion was controlled to be in an appropriate range. The neck portion corresponds to a portion affected by arc heat input when a ball is formed (hereinafter, a heat-affected portion). The crystal grain size of the heat-affected portion is coarsened by the arc heat input, but it is considered that pre-control of the average crystal grain size of the bonding wire was effective to control the crystal grain size of the neck portion.

When the average crystal grain size is less than 0.4 µm or larger than 2.1 µm, the effect of reducing the damage of the neck portion is not sufficient. When the average crystal grain size was less than 0.4 µm, occurrence of a crack was observed at the bent portion of the neck portion. This is considered to be because the average crystal grain size of the neck portion was made finer and thus the deformation resistance to bending deformation became excessively high. When the average crystal grain size was larger than 2.1 µm, damage such as breakage of the wire caused by excessive deformation of the neck portion was observed. This is considered to be because the average crystal grain size of the neck portion was coarsened and the deformation resistance to bending deformation was insufficient or the like.

(Reduction of Damage of Neck Portion During Formation of Low Loop)

It is further preferable in the bonding wire of the present embodiment that the total of abundance ratios of the crystal orientations <111> and <100> having an angular difference of 15 degrees or less from the direction of the wire center axis out of the crystal orientations in a section in a direction parallel to the wire center axis is 25% or more and less than 60% in average area percentage. As a result, even when a low loop is formed, an effect of reducing damage to the neck portion can be obtained. The reason for this is not clear, but it is considered that the crystal orientations <111> and <100> have a great influence on the control of the deformability against the bending deformation of the neck portion, and thus the plastic deformability against bending deformation of the neck portion could be properly controlled by appropriately controlling the total of the abundance ratios of these crystal orientations.

When the total of the abundance ratios of the crystal orientations <111> and <100> is less than 25% or 60% or more in average area percentage, the effect of suppressing damage to the neck portion under low loop is not sufficient. When the total of the abundance ratios was less than 25%, damage such as breakage of the wire caused by excessive deformation of the neck portion was observed. This is considered to be because the deformation resistance to bending deformation is insufficient or the like. When the total of the abundance ratios was 60% or more, occurrence of a crack was observed at the bent portion of the neck portion. This is considered to be because the deformation resistance to bending deformation became excessively high.

(Improvement of Ball Bond Area Life in High Temperature Storage Test)

It is further preferable that the bonding wire of the present embodiment further contains one or more of Ni, Pd, Pt, and Au for a total of 0.01 mass % or more and 1.5 mass % or less, the balance being Cu and unavoidable impurities. As a result, the ball bond area life in the high-temperature storage test at 200° C. can be improved to 500 hours or more. A reason for this is considered to be that Ni, Pd, Pt, or Au has an effect of reducing the growth rate of Cu-Al-based intermetallic compounds that cause separation at the interface between the ball and the Al electrode. When the concentration of the above elements is less than 0.01 mass %, the effect of improving the ball bond area life in the high-temperature storage test at 200° C. is not sufficient. When the concentration of the elements exceeds 1.5 mass %, the hardness of the ball increases, and the formation of the intermetallic compounds becomes non-uniform, so that the effect of improving the ball bond area life in the high-temperature storage test at 200° C. is not sufficient.

(Suppression of Defect of Crimped Ball Shape)

It is further preferable that the bonding wire of the present embodiment further contains one or more of P, In, Ga, Ge and Ag for a total of 0.001 mass % or more and 0.75 mass % or less, the balance being Cu and unavoidable impurities. As a result, an effect of suppressing a defect in which the crimped ball shape is deformed into a petal-like shape can be obtained. It is presumed that such an effect was obtained because crystal grains constituting the ball were made finer, and isotropic deformation was promoted. When the concentration is less than 0.001 mass %, the above effect is not sufficient because an effect of making crystal grains finer is insufficient. When the concentration exceeds 0.75 mass %, segregation of elements inside the ball becomes remarkable, and variation of crystal grains constituting the ball increases, so that the above effect is not sufficient.

(Method of Producing Bonding Wire)

A method for producing a bonding wire for a semiconductor device according to the present embodiment will be described.

(Method of Preparing Copper Alloy)

First, high-purity copper having Cu purity of 4N to 6N (Cu concentration: 99.99 mass % or more and 99.9999 mass % or less) is used as a raw material, and is melted together with elements to be added, thereby preparing an ingot of a copper alloy. When preparing a copper alloy, a method of directly melting and alloying copper and high-purity additive elements, a method of preparing a master alloy made up of copper and approximately 3 to 5 mass % of additive elements in advance, and then melting and alloying copper with the master alloy or another method may be used. The technique that uses a master alloy is effective in making an element distribution uniform at a low concentration. An arc melting furnace, high-frequency melting furnace, or the like can be used for the melting. To prevent admixture of atmospheric gases such as $O_2$ and $H_2$, preferably the melting is done in a vacuum atmosphere or in an inert atmosphere of Ar, $N_2$, or another gas. Preferably, surfaces of the ingot are washed with acid or alcohol to remove oxide and stains, followed by subsequent drying.

(Processing, Heat Treatment Method)

The copper alloy ingot thus produced is first processed into a linear shape by a rolling or forging process. Subsequently, it is preferable that the ingot is processed to be reduced in diameter by a drawing process until a final wire diameter is reached. A continuous wire drawing machine capable of being equipped with plural diamond-coated dies can be used for the drawing process. It is preferable that a lubricant is used during continuous wire drawing to reduce worn-out of the dies and wire surface flaws. At an intermediate wire diameter in a preceding stage before the final wire diameter is reached, a heat treatment is carried out at an intermediate stage of the drawing process to remove strain, etc. A heat treatment to be performed at an intermediate wire diameter is referred to as an intermediate heat treatment herein. The wire after the intermediate heat treatment is subjected to the drawing process until the final wire diameter used as a product is reached. The step of performing the drawing process from the wire diameter at which the intermediate heat treatment is performed herein till the final wire diameter is referred to as a final drawing process. At the final wire diameter, a heat treatment for recrystallizing the bonding wire to adjust mechanical characteristics thereof is performed. A heat treatment to be performed at the final wire diameter is referred to as a final heat treatment herein. A method for performing a heat treatment while continuously running a wire can be used in the intermediate heat treatment and the final heat treatment. Note that in order to suppress oxidation of the bonding wire surface as much as possible, the heat treatment is preferably performed in an inert atmosphere in which Ar gas or $N_2$ gas is refluxed. It is also effective to include several percentages of $H_2$ as a reducing gas component in an inert atmosphere.

(Method for Controlling Crystal Orientation on Wire Surface)

There will be described an example of a method for controlling each of the abundance ratios of the crystal orientations <100>, <110>, and <111> having an angular difference of 15 degrees or less from a direction perpendicular to one plane including the wire center axis out of the crystal orientations on the wire surface so that each abundance ratio is 3% or more and less than 27% in average area percentage.

In order to control the abundance ratios of the crystal orientations <100>, <110>, and <111>, it is effective to control, for example, an intermediate heat treatment condition, a final drawing condition, and a final heat treatment condition. A reason for this is considered as follows. The final heat treatment after the final drawing process causes recrystallization and grain growth on the wire surface. Here, what crystal orientations crystal grains generated by recrystallization have and how degree crystal grains having what crystal orientations grow are influenced by the amount of processing strain, temperature and time of the final heat treatment, etc. One example is a method for generating a recrystallization nucleus having a specific crystal orientation by the drawing process, and performing a heat treatment on the nucleus under a specific condition to preferentially grow the nucleus. The amount of processing strain is considered as one of factors affecting the formation of recrystallization nuclei. The processing strain to be introduced in the process for producing the bonding wire can be also introduced by rolling, forging or the like, but in order to stably control the amount of processing strain, it is preferable to control the amount of processing strain by only the final drawing process rather than combination of a plurality of processing. For that purpose, it is effective to perform the intermediate heat treatment. The amount of processing strain can be sufficiently reduced by performing the intermediate heat treatment at a temperature which is not less than a temperature at which recovery or recrystallization occurs, for a certain time or more. Therefore, by performing the intermediate heat treatment at an appropriate wire diameter, only the amount of processing strain to be introduced into the material by the final drawing process may be considered as the amount of processing strain accumulated at the stage where the final heat treatment is performed, and it is possible to stably control the crystal orientation.

Based on such a concept, a control method for the intermediate heat treatment, the final drawing process, and the final heat treatment will be described. It is effective that the intermediate heat treatment is performed at 630° C. or more and less than 750° C. for 0.05 seconds or more and less than 1.5 seconds. When the temperature of the intermediate heat treatment is less than 630° C. or when the heat treatment time is less than 0.05 seconds, the effect of reducing the amount of processing strain cannot be sufficiently obtained, and the abundance ratios of the crystal orientations <100>, <110>, and <111> cannot be stably controlled. When the temperature of the intermediate heat treatment is 750° C. or more or when the heat treatment time is 1.5 seconds or more, the crystal grains coarsen and the wire is excessively softened, and the frequency of breaking of wire increases in the subsequent final drawing process. Therefore, this condition is not suitable for practical use.

It is considered that the amount of processing strain introduced in the final drawing process has a positive correlation with the processing rate of the final drawing process defined by the following expression.

$$P_f = \{(R_m^2 - R_f^2)/R_m^2\} \times 100$$

$P_f$: Processing rate of final drawing process
$R_m$: Diameter (mm) of wire which has been subjected to the intermediate heat treatment, $R_f$: Diameter (mm) of wire which has been subjected to the final heat treatment It is effective that the processing rate of the final drawing process is 57% or more and less than 87%. When the processing rate of the final drawing process is less than 57%, the abundance ratio of any of the crystal orientations <100>, <110>, and <111> becomes less than 3%. This is considered to be because the amount of processing strain in the final drawing process was insufficient, and the generation of recrystallization nuclei necessary for growing the above crystal orientation was insufficient or the like. When the processing rate of the final drawing process is 87% or more, the crystal orientation <110> is 27% or more. This is considered to be because the amount of processing strain in the final drawing process was excessive and many recrystallization nuclei having the crystal orientation <100> were generated or the like.

It is effective that the final heat treatment is performed at 660° C. or more and less than 750° C. for 0.05 seconds or more and less than 1.5 seconds. When the temperature of the final heat treatment is less than 680° C. or when the heat treatment time is less than 0.05 seconds, the abundance ratio of the crystal orientation <110> is 27% or more. When the temperature of the final heat treatment is 750° C. or more, or when the heat treatment time is 1.5 seconds or more, the wire is excessively softened and thus sufficient wire bondability cannot be obtained.

Next, there will be described an example of a method of controlling the total of the abundance ratios of the crystal orientations <100>, <110>, and <111> having an angular difference of 15 degrees or less from a direction perpendicular to one plane including the wire center axis out of the crystal orientations on the wire surface so that the total of the abundance ratios is 15% or more and less than 50%. In order to control the total of the abundance ratios of the crystal orientations <100>, <110>, and <111>, it is effective that a first pre-final heat treatment is performed under a specific condition between the final drawing process and the final heat treatment. In other words, it is effective that the wire producing process performs the intermediate heat treatment, the final drawing process, the first pre-final heat treatment, and the final heat treatment in turn.

It is effective that the first pre-final heat treatment is performed at 550° C. or more and less than 680° C. for 0.05 seconds or more and less than 0.5 seconds. This is because the abundance ratios of the crystal orientations to be formed in the final heat treatment can be controlled by performing the first pre-final heat treatment in an appropriate condition range. When the temperature of the first pre-final heat treatment is less than 550° C. or when the heat treatment time is less than 0.05 seconds, the total of the abundance ratios of the crystal orientations <100>, <110>, and <111> becomes 50% or more. When the temperature of the first heat treatment is 680° C. or more or when the heat treatment time is 0.5 seconds or more, the total of the abundance ratios of the crystal orientations <100>, <110>, and <111> becomes less than 15%.

Next, there will be described an example of a method of controlling X, Y and Z to satisfy the relationship of X+Y>Z when the abundance ratios of the crystal orientations <100>, <110> and <111> having an angular difference of 15 degrees or less from a direction perpendicular to one plane including the wire center axis out of the crystal orientations on the wire surface are represented by X, Y and Z, respectively. In order for X, Y, and Z to satisfy X+Y>Z, it is effective to perform a second pre-final heat treatment under a specific condition between the final drawing process and the first pre-final heat treatment. That is, it is effective that the wire producing process performs the intermediate heat treatment, the final drawing process, the second pre-final heat treatment, the first pre-final heat treatment, and the final heat treatment in turn.

It is effective that the second pre-final heat treatment is performed at 450° C. or more and less than 550° C. for 0.05 seconds or more and less than 0.5 seconds. This is because the crystal orientations <100> and <110> increase with the final heat treatment by performing the second pre-final heat treatment in an appropriate condition range, so that the value of X+Y increases. When the temperature of the second pre-final heat treatment is less than 450° C. or when the heat treatment time is less than 0.05 seconds, the foregoing X, Y and Z cannot satisfy X+Y>Z. This is considered to be because an effect of increasing the value of X+Y cannot be obtained. When the temperature of the second pre-final heat treatment is 550° C. or more for 0.5 seconds or more, the foregoing X, Y, and Z cannot satisfy X+Y>Z. This is considered to be because the crystal orientation <111> grows more easily than the crystal orientations <100> and <110>.

Next, there will be described an example of a method of controlling the abundance ratios of the crystal orientations <121> and <123> having an angular difference of 15 degrees or less from a direction perpendicular to one plane including the wire central axis out of the crystal orientations on the wire surface so that each of the abundance ratios is less than 15% in average area percentage. In order to control each of the abundance ratios of the crystal orientations <121> and <123> to be less than 15% in average area percentage, it is effective that the wire is annealed while fed in a reflux furnace in which Ar gas is refluxed in the final heat treatment step. This is considered to be because the cooling rate of the wire is reduced because the heat treatment is performed while refluxing Ar gas having a relatively low thermal conductivity, and thus the growth of the crystal orientations <121> and <123> is suppressed. In the final heat treatment step, $N_2$ is promising as an inert gas other than Ar from the viewpoint of cost and safety. However, since $N_2$ has a thermal conductivity higher than Ar gas, an effect of controlling the abundance ratios of the crystal orientations <121> and <123> to be less than 15% in average area percentage cannot be obtained.

Next, an example of a method for controlling the average crystal grain size in a section perpendicular to the wire center axis to be 0.4 μm or more and 2.1 μm or less will be described. In order to control the average crystal grain size to be 0.4 μm or more and 2.1 μm or less, it is effective to set the wire feed speed in the final drawing process to 750 m/min or more and 1200 m/min or less. This is considered to be because the amount of processing strain can be controlled by setting the wire feed speed in the final drawing process to a specific range, and the recrystallization behavior and grain growth behavior in the subsequent final heat treatment step changed. When the wire feed speed in the final drawing process is less than 750 m/min, the average crystal grain size increases to more than 2.1 μm. This is considered to be because the amount of processing strain accumulated inside the material was small. When the wire feed speed in the final drawing process is more than 1200 m/min, the average crystal grain size decreases to less than 0.4 μm.

Next, there will be described an example of a method of controlling the total of the abundance ratios of the crystal orientations <111> and <100> having an angular difference of 15 degrees or less from the wire center axis out of the crystal orientations in a section in a direction parallel to the wire center axis so that the total of the abundance ratios is 25% or more and less than 60% in average area percentage. In order to control the total of the abundance ratios of the crystal orientations <111> and <100> to be 25% or more and less than 60% in average area percentage, the processing rate per die in the final drawing process is set to 18% or more and less than 21%. This is considered to be because it is possible to control the frictional force generated at the interface between the die and the wire associated with the development of the crystal orientations in the direction of the wire center axis on the wire surface by changing the processing rate per die. Here, the processing rate per die is a percentage representing the proportion of an area in a direction perpendicular to the wire center axis reduced by the processing to a cross-sectional area of the wire before processing in the direction perpendicular to the wire center axis. When the processing rate per die is less than 18%, the total of the abundance ratios of the crystal orientations <111> and <100> is less than 25%. When the processing rate per die is 21% or more, the total of the abundance ratios of the crystal orientations <111> and <100> is 60% or more.

Next, an example of a method of adding Ni, Pd, Pt, Au, P, In, Ga, Ge, and Ag to the bonding wire will be described. When copper is added with an alloying element to be alloyed, a method of directly melting and alloying copper and high-purity dopants, a method in which a master alloy in which dopants of about 3 to 5 mass % are added in copper is prepared in advance, and copper and the master alloy are melted and alloyed, or other methods may be used. A method using a master alloy is effective to a case where an element distribution is made uniform at a low concentration.

EXAMPLES

A method for producing a bonding wire will be described. Cu used as a raw material had a purity of 99.99 mass % or more, the balance being unavoidable impurities. When the bonding wire contained Ni, Pd, Pt, Au, P, In, Ga, Ge, and Ag as dopants, Cu and these elements were melted in a high-frequency melting furnace and alloyed together. When a target total concentration of the dopants except the unavoidable impurities was less than 0.5 mass %, an alloy of the intended concentration was produced by using a Cu alloy containing high concentrations of the dopants. An Ar atmosphere was used as an atmosphere during melting to prevent admixture of impurities such as oxygen. The ingot produced by melting had a columnar shape with a diameter of about 5 mm.

Thereafter, forging process and drawing process were performed on the ingot to prepare a wire having an intermediate wire diameter. The wire diameter of the wire having the intermediate wire diameter was calculated backward from the final wire diameter, and was determined to be a wire diameter at which the drawing rate of the final drawing process was 57% or more and less than 87%. Thereafter, the intermediate heat treatment was performed on the wire having the intermediate wire diameter at 630° C. or more and less than 750° C. for 0.05 seconds or more and less than 1.5 seconds. Subsequently, the final drawing process was performed under the condition that the drawing rate was 57% or more and less than 87%, and a wire having a wire diameter of ϕ20 μm was produced. Thereafter, the final heat treatment was performed at 660° C. or more and less than 750° C. for 0.05 seconds or more and less than 1.5 seconds. Further, for some of the samples, the first pre-final heat treatment and the second pre-final heat treatment were performed before the final heat treatment. The condition of the first pre-final heat treatment was set to 550° C. or more and less than 680° C., and 0.05 seconds or more and less than 0.5 seconds. The condition for the second pre-final heat treatment was set to 450° C. or more and less than 550° C., and 0.05 seconds or more and less than 0.5 second. The atmosphere during the final heat treatment was set to an Ar atmosphere or a $N_2$ atmosphere. The wire feed speed in the final drawing process was changed in a range of 600 m/min or more and 1300 m/min or less. The processing rate per die in the final drawing process was changed in a range of 16% or more and 23% or less.

(Evaluation Method: Concentration Analysis of Elements Contained in Bonding Wire)

An ICP optical emission spectrometer was used for the concentration analysis of the elements contained in the bonding wire of the present embodiment.

(Evaluation Method: Crystal Orientation Analysis of Wire Surface)

The abundance ratios of the crystal orientations <100>, <110>, <111>, <121>, and <123> having an angular difference of 15 degrees or less from a direction perpendicular to one plane including the wire center axis out of the crystal orientations on the wire surface of the bonding wire of the present embodiment were calculated from data measured by the EBSD method. The abundance ratio was set as an average value of values obtained by measuring five wires at intervals of about 3 m. A measurement region was set to a region surrounded by straight lines of 5 μm (25% of the wire diameter) in the circumferential direction and 40 μm in the direction of the wire center axis. Furthermore, the measurement region was set to a region including the highest position in the circumferential direction of the sample fixed to the sample stage.

(Evaluation Method: Average Crystal Grain Size Analysis in a Section Perpendicular to Wire Center Axis)

The average crystal grain size in a section perpendicular to the wire center axis of the bonding wire of the present embodiment was calculated from data measured by the EBSD method after the wire section was processed with an Ar ion beam to be exposed. Five wires were obtained at intervals of about 3 m, and an average value of measured values of the respective wires was set as the average crystal grain size. A measurement region was set to a region including all sections perpendicular to the wire center axis.

(Evaluation Method: Crystal Orientation Analysis in Section in Direction Parallel to Wire Center Axis)

The total of the abundance ratios of the crystal orientations <111> and <100> having an angular difference of 15 degrees or less from the direction of the wire center axis of the bonding wire in a section in a direction parallel to the wire center axis of the present embodiment was calculated from data measured by the EBSD method after the wire section was processed with an Ar ion beam to be exposed. The total of the abundance ratios was an average of the measured values of ten wires obtained at intervals of about 3 m. A measurement region was set to a rectangular region of 80 μm in the direction of the wire center axis and 20 μm in the diameter direction. Further, the measurement region was set to a region containing both ends of the wire in the diameter direction.

(Evaluation Method for Straightness of Loops)

Straightness of loops was evaluated from the frequency of occurrence of loops having low straightness when bonding wires were bonded. An optical microscope was used to observe the loop portion. The loop length was set to 7.0 mm, and the loop height was set to 0.2 mm. The loop portion was observed from immediately above the loop, and it was determined that the straightness of the loop was low when the longest distance from a straight line connecting the ball bond area and wire bond area to the loop portion was 10 μm or more. Loops of two hundred bonding wires were observed. When five or more loops having low straightness were observed, −1 point was given by judging that straightness was defective, when the number of loops having low straightness was three or more and less than five, 0 point was given by judging that the straightness was within an allowable range and practically usable although a defect occurred. When the number of loops having low straightness was two or less, 1 point was given by judging that there was no problem in practical use. Evaluation results are shown in the column of "Straightness of loops" in Table 2. The −1 point is rejected, and the 0 and 1 points are accepted.

(Evaluation Method for Straightness of Loops After Resin Sealing)

The straightness of loops after resin sealing was evaluated from the frequency of occurrence of loops having low straightness when sealing was performed with a general-purpose mold resin after bonding wires were bonded. A soft X-ray apparatus was used for observation of the loop portion. The loop length was set to 7.0 mm, and the loop height was set to 0.2 mm. The loop portion was observed from immediately above the loop, and it was determined that the straightness of the loop was low when the longest distance from a straight line connecting the ball bond area and wire bond area to the loop portion was 15 μm or more. Loops of two hundred bonding wires were observed. When six or more loops having low straightness were observed, −1 point was given by judging that straightness was defective, and when the number of loops having low straightness was four or more and less than six, 0 point was given by judging that straightness was within an allowable range and practically usable although a defect occurred. When three loops having low straightness were observed, 1 point was given by judging that there was no problem in practical use, when two loops having low straightness were observed, 2 points were given by judging that straightness was excellent, when one loop having low straightness was observed, 3 points were given by judging that straightness was further excellent, and when all the loops had high straightness, 4 points were given by judging that straightness was particularly excellent. Evaluation results are shown in the column of "Straightness of loops after resin sealing" in Table 2. The −1 point is rejected, and the other points are accepted.

(Evaluation Method for Damage of Neck Portion)

The neck portion was observed after the bonding wire was bonded, and the damage of the neck portion was evaluated from the number of places at which damage occurred. The loop length was set to 7.0 mm, the loop height was set to 0.2 mm, and the loop shape was set to a trapezoidal shape. The neck portions of the two hundred bonded bonding wires were observed by a scanning electron microscope, and when there were two or more places at which damage occurred, 0 point was given by judging that the neck portion was defective. When there was only one place at which damage occurred, 1 point was given by judging that there was no problem in practical use, and when no defect occurred, 2 points were given by judging that the neck portion was excellent. Evaluation results are shown in the column of "Damage Neck Portion" in Table 2. The 0 point is rejected, and the other points are accepted.

(Evaluation Method of Damage of Neck Portion Under Low Loop)

In the evaluation of the damage of the neck portion under the low loop, the loop height was set to 0.1 mm which was lower than usual, and a method similar to the evaluation method for the damage of the neck portion was used. Neck portions of the two hundred bonded bonding wires were observed by a scanning electron microscope, and when there were two or more places at which damage occurred, 0 point was given by judging that the neck portion was defective. When there was only one place at which damage occurred, 1 point was given by judging that there was no problem in practical use, and when no defect occurred, 2 points were given by judging bonding was excellent. Evaluation results are shown in the column of "Damage of Neck Portion under Low Loop" in Table 2. The 0 point is rejected, and the other points are accepted.

(Evaluation Method for Ball Bond Area Life in High Temperature Storage Test)

After the bonding wire was bonded and sealed with a general-purpose resin, the bonding wire was left in a thermostatic oven set at 200° C., and the ball bond area life in the high-temperature storage test was evaluated from a time required until the bonding strength of the ball bond area was reduced to 50% or less of that before the test. An average value of values obtained by measuring the strength of ten randomly selected ball bond areas with a micro shear tester was used as the value of the bonding strength for the judgment of the ball bond area life. When the bonding strength was measured, the resin was removed by an acid treatment in order to expose the ball bond area. The diameter of the ball was set in a range of 1.5 to 1.7 times the diameter of the wire. During formation of the ball, a gas of $N_2$+5 volume % $H_2$ was blown at a flow rate of 0.4 to 0.6 L/min to prevent oxidation. In the above evaluation, when the ball bond area life was less than 500 hours, 0 point was given by judging that there was a problem in practical use, when the ball bond area life was 500 hours or more and less than 700 hours, 1 point was given by judging that there was no problem in practical use, and when the ball bond area life was 700 hours or more, 2 points were given by judging that the ball bond area life was excellent. Evaluation results are shown in the column of "Ball bond area life in high-temperature storage test" in Table 2. The 0 point is rejected, and the other points are accepted.

(Evaluation Method for Crimped Ball Shape)

Ball bonding to an Al electrode on an Si substrate was performed at 100 times, and the crimped ball shape was evaluated from the number of occurring defective crimped ball shapes. With respect to the judgement for the crimped ball shape, the ball was observed from immediately above the ball bond area, when the crimped ball shape was close to a circular shape, it was judged to be good, whereas when the crimped ball shape was a petal-like shape, it was judged to be defective. An optical microscope was used to observe the crimped ball shape. One hundred ball bond areas were observed, and when there were nine or more defects, 0 point was given by judging that there was a problem in practical use. When the number of defects was eight or less and six or more, 1 point was given by judging that there was no problem in practical use, and when the number of defects was five or less and three or more, 2 points were given by judging that the crimped ball shape was excellent. Evaluation results are shown in the column of "Crimped ball shape" in Table 2. Only 0 points are rejected, others are accepted.

(Description of Evaluation Results)

Example Nos. 1 to 87 were Cu alloy bonding wires for semiconductor devices in which each of the abundance ratios of the crystal orientations <100>, <110> and <111> having an angular difference of 15 degrees or less from a direction perpendicular to one plane including the wire center axis out of the crystal orientations on the wire surface was 3% or more and less than 27% in average area percentage, and thus the straightness of loops thereof was within an allowable range. Each of the abundance ratios of the example Nos. 1 to 75 was 5% or more and less than 25% in average area percentage, and thus the straightness of loops had no problem in practical use.

Example Nos. 4 and 5 were Cu alloy bonding wires for semiconductor devices in which each of the abundance ratios of the crystal orientations <100>, <110> and <111> having an angular difference of 15 degrees or less from a direction perpendicular to one plane including the wire center axis out of the crystal orientations on the wire surface was 3% or more and less than 27% in average area percentage, and further the total of the abundance ratios of the crystal orientations <100>, <110> and <111> having the angular difference of 15 degrees or less from the direction perpendicular to one plane including the wire center axis out of the crystal orientations on the wire surface was 15% or more and less than 50% in average area percentage. Therefore, an excellent evaluation result was obtained for the straightness of loops after resin sealing.

Examples 1, 6, 7, 15, and 16 were Cu alloy bonding wires for semiconductor devices in which each of the abundance ratios of the crystal orientations <100>, <110> and <111> having the angular difference of 15 degrees or less from the direction perpendicular to one plane including the wire center axis out of the crystal orientations on the wire surface was 3% or more and less than 27% in average area percentage, further the total of the abundance ratios of the crystal orientations <100>, <110> and <111> having the angular difference of 15 degrees or less from the direction perpendicular to one plane including the wire center axis out of the crystal orientations on the wire surface was 15% or more and less than 50% in average area percentage, and further X+Y>Z was satisfied when the abundance ratios of the crystal orientations <100>, <110> and <111> having the angular difference of 15 degrees or less from the direction perpendicular to one plane including the wire center axis out of the crystal orientations on the wire surface were represented by X, Y and Z, respectively. Therefore, a further excellent evaluation result was obtained for the straightness of loops after resin sealing.

Examples 8 to 14, 17 to 27 and 29 to 75 were Cu alloy bonding wires for semiconductor devices in which each of the abundance ratios of the crystal orientations <100>, <110> and <111> having the angular difference of 15 degrees or less from the direction perpendicular to one plane including the wire center axis out of the crystal orientations on the wire surface was 3% or more and less than 27% in average area percentage, further the total of the abundance ratios of the crystal orientations <100>, <110> and <111> having the angular difference of 15 degrees or less from the direction perpendicular to one plane including the wire center axis out of the crystal orientations on the wire surface was 15% or more and less than 50% in average area percentage, further X+Y>Z was satisfied when the abundance ratios of the crystal orientations <100>, <110> and <111> having the angular difference of 15 degrees or less from the direction perpendicular to one plane including the wire center axis out of the crystal orientations on the wire surface were represented by X, Y and Z respectively, and further each of the abundance ratios of the crystal orientations <121> and <123> having an angular difference of 15 degrees or less from a direction perpendicular to one plane including the wire center axis out of the crystal orientations on the wire surface was less than 15% in average area percentage. Therefore, a particularly excellent evaluation result was obtained for the straightness of loops after resin sealing.

Example Nos. 2 to 8, 10, and 12 to 87 were Cu alloy bonding wires for semiconductor devices in which the average crystal grain size in a section perpendicular to the wire center axis was 0.4 µm or more and 2.1 µm or less. Therefore, an excellent evaluation result was obtained for the damage of the neck portion.

Example Nos. 5 to 12, 14, 16 to 75 were Cu alloy bonding wires for semiconductor devices in which the total of the abundance ratios of the crystal orientations <111> and <100> having the angular difference of 15 degrees or less from the wire center axis out of crystal orientations in a section in a direction parallel to the wire center axis was 25% or more and less than 60% in average area percentage. Therefore, an excellent evaluation result was obtained for the damage of the neck portion under low loop.

Example Nos. 24 to 30, 38 to 46, 48, 49, 51 to 55, 57 to 63, and 71 to 74 were Cu alloy bonding wires for semiconductor devices, each of which contains one or more of Ni, Pd, Pt, and Au for a total of 0.01 mass % or more and 1.5 mass % or less, the balance being Cu and unavoidable impurities. Therefore, an excellent evaluation result was obtained from the ball bond area life in the high-temperature storage test.

Example Nos. 50 to 54, 60 to 70, and 72 to 74 were Cu alloy bonding wires for semiconductor devices, each of which contains at least one of P, In, Ga, Ge, and Ag for a total of 0.001 mass % or more and 0.75 mass % or less. Therefore, an excellent evaluation result was obtained for the crimped ball shape.

TABLE 1-1

| | | Crystal orientation on wire surface | | | | | | Average crystal grain size |
|---|---|---|---|---|---|---|---|---|
| | | Abundance ratio of crystal orientation having angular difference of 15 degrees or less from direction perpendicular to one place including wire center axis (%) | | | <100> + <110> + <111> | Whether X + Y > Z is satisfied? | | in section perpendicular to wire center axis (um) |
| | No. | <100>:X | <110>:Y | <111>:Z | <121> | <123> | | |

| | No. | <100>:X | <110>:Y | <111>:Z | <121> | <123> | <111> | X+Y>Z | grain size |
|---|---|---|---|---|---|---|---|---|---|
| Examples | 1 | 5 | 5 | 5 | 15 | 15 | 15 | ○ | 0.3 |
| | 2 | 24 | 24 | 24 | 5 | 7 | 72 | ○ | 0.5 |
| | 3 | 12 | 14 | 24 | 8 | 14 | 50 | ○ | 1.7 |
| | 4 | 13 | 11 | 24 | 8 | 14 | 48 | × | 1.5 |
| | 5 | 5 | 5 | 11 | 8 | 10 | 21 | × | 1.6 |
| | 6 | 11 | 5 | 6 | 15 | 16 | 22 | ○ | 1.5 |
| | 7 | 5 | 11 | 7 | 16 | 15 | 23 | ○ | 1.7 |
| | 8 | 15 | 17 | 9 | 5 | 3 | 41 | ○ | 1.8 |
| | 9 | 8 | 9 | 6 | 3 | 2 | 23 | ○ | 0.3 |
| | 10 | 9 | 8 | 7 | 3 | 3 | 24 | ○ | 0.4 |
| | 11 | 8 | 8 | 6 | 2 | 3 | 22 | ○ | 2.2 |
| | 12 | 8 | 9 | 8 | 8 | 10 | 25 | ○ | 2.1 |
| | 13 | 9 | 8 | 10 | 7 | 10 | 27 | ○ | 1.6 |
| | 14 | 10 | 9 | 9 | 8 | 11 | 28 | ○ | 1.3 |
| | 15 | 18 | 15 | 13 | 15 | 16 | 46 | ○ | 1.4 |
| | 16 | 13 | 16 | 13 | 16 | 18 | 42 | ○ | 1.5 |
| | 17 | 14 | 18 | 8 | 6 | 3 | 40 | ○ | 1.7 |
| | 18 | 16 | 17 | 10 | 4 | 4 | 43 | ○ | 1.5 |
| | 19 | 15 | 18 | 9 | 5 | 3 | 42 | ○ | 1.8 |
| | 20 | 15 | 19 | 10 | 6 | 5 | 44 | ○ | 1.6 |
| | 21 | 14 | 17 | 9 | 4 | 3 | 40 | ○ | 0.9 |
| | 22 | 17 | 18 | 10 | 3 | 4 | 45 | ○ | 0.7 |
| | 23 | 18 | 17 | 9 | 4 | 6 | 44 | ○ | 1.0 |
| | 24 | 18 | 18 | 8 | 7 | 7 | 42 | ○ | 1.5 |
| | 25 | 18 | 22 | 7 | 8 | 6 | 47 | ○ | 2.0 |
| | 26 | 18 | 20 | 9 | 7 | 7 | 47 | ○ | 1.6 |
| | 27 | 17 | 21 | 8 | 5 | 8 | 46 | ○ | 1.6 |
| | 28 | 20 | 21 | 9 | 6 | 7 | 50 | ○ | 1.9 |
| | 29 | 17 | 20 | 8 | 5 | 8 | 45 | ○ | 1.5 |
| | 30 | 19 | 19 | 9 | 5 | 8 | 47 | ○ | 1.7 |
| | 31 | 8 | 12 | 8 | 7 | 7 | 28 | ○ | 1.4 |
| | 32 | 6 | 8 | 12 | 6 | 7 | 26 | ○ | 1.2 |
| | 33 | 14 | 15 | 10 | 4 | 6 | 39 | ○ | 1.2 |
| | 34 | 15 | 14 | 10 | 8 | 6 | 39 | ○ | 1.0 |
| | 35 | 14 | 15 | 7 | 4 | 5 | 36 | ○ | 1.1 |
| | 36 | 14 | 19 | 8 | 5 | 5 | 41 | ○ | 1.3 |

| | | Crystal orientation in section in direction parallel to wire center axis Abundance ratio of crystal orientation having angular difference of 15 degree or less from wire center axis (%) | | | Contents of elements (mass %) | | | | | Contents of elements (mass %) | | | | | |
|---|---|---|---|---|---|---|---|---|---|---|---|---|---|---|---|
| | No. | <1-1> | <100> | Total | Ni | Pd | Pt | Au | Total | P | In | Ga | Ge | Ag | Total |
| Examples | 1 | 5 | 13 | 18 | — | — | — | — | 0.000 | — | — | — | — | — | 0.000 |
| | 2 | 7 | 15 | 22 | — | — | — | — | 0.000 | — | — | — | — | — | 0.000 |
| | 3 | 8 | 14 | 22 | — | — | — | — | 0.000 | — | — | — | — | — | 0.000 |
| | 4 | 9 | 14 | 23 | — | — | — | — | 0.000 | — | — | — | — | — | 0.000 |
| | 5 | 18 | 23 | 41 | — | — | — | — | 0.000 | — | — | — | — | — | 0.000 |
| | 6 | 17 | 25 | 42 | — | — | — | — | 0.000 | — | — | — | — | — | 0.000 |
| | 7 | 18 | 22 | 40 | — | — | — | — | 0.000 | — | — | — | — | — | 0.000 |
| | 8 | 17 | 22 | 39 | — | — | — | — | 0.000 | — | — | — | — | — | 0.000 |
| | 9 | 16 | 20 | 36 | — | — | — | — | 0.000 | — | — | — | — | — | 0.000 |
| | 10 | 15 | 19 | 34 | — | — | — | — | 0.000 | — | — | — | — | — | 0.000 |
| | 11 | 16 | 20 | 36 | — | — | — | — | 0.000 | — | — | — | — | — | 0.000 |
| | 12 | 16 | 22 | 38 | — | — | — | — | 0.000 | — | — | — | — | — | 0.000 |
| | 13 | 11 | 13 | 24 | — | — | — | — | 0.000 | — | — | — | — | — | 0.000 |
| | 14 | 12 | 13 | 25 | — | — | — | — | 0.000 | — | — | — | — | — | 0.000 |
| | 15 | 26 | 34 | 60 | — | — | — | — | 0.000 | — | — | — | — | — | 0.000 |
| | 16 | 27 | 32 | 59 | — | — | — | — | 0.000 | — | — | — | — | — | 0.000 |
| | 17 | 19 | 20 | 39 | 0.008 | — | — | — | 0.008 | — | — | — | — | — | 0.000 |
| | 18 | 18 | 21 | 39 | — | 0.009 | — | — | 0.009 | — | — | — | — | — | 0.000 |

TABLE 1-1-continued

| No. | | | | | | | | | | | | | | |
|---|---|---|---|---|---|---|---|---|---|---|---|---|---|---|
| 19 | 19 | 22 | 41 | — | — | 0.009 | — | 0.009 | — | — | — | — | — | 0.000 |
| 20 | 17 | 20 | 37 | — | — | — | 0.008 | 0.008 | — | — | — | — | — | 0.000 |
| 21 | 18 | 21 | 39 | 0.005 | — | — | 0.003 | 0.008 | — | — | — | — | — | 0.000 |
| 22 | 19 | 20 | 39 | — | — | 0.004 | 0.005 | 0.009 | — | — | — | — | — | 0.000 |
| 23 | 29 | 20 | 49 | — | 0.003 | 0.003 | 0.003 | 0.009 | — | — | — | — | — | 0.000 |
| 24 | 18 | 22 | 40 | 0.010 | — | — | — | 0.010 | — | — | — | — | — | 0.000 |
| 25 | 17 | 18 | 35 | — | 0.010 | — | — | 0.010 | — | — | — | — | — | 0.000 |
| 26 | 18 | 22 | 40 | — | — | 0.010 | — | 0.010 | — | — | — | — | — | 0.000 |
| 27 | 19 | 21 | 40 | — | — | — | 0.011 | 0.011 | — | — | — | — | — | 0.000 |
| 28 | 18 | 17 | 35 | 0.005 | — | — | 0.005 | 0.010 | — | — | — | — | — | 0.000 |
| 29 | 17 | 18 | 35 | — | — | 0.005 | 0.006 | 0.011 | — | — | — | — | — | 0.000 |
| 30 | 18 | 20 | 38 | — | 0.003 | 0.004 | 0.004 | 0.011 | — | — | — | — | — | 0.000 |
| 31 | 17 | 25 | 42 | 1.600 | — | — | — | 1.600 | — | — | — | — | — | 0.000 |
| 32 | 19 | 22 | 41 | — | 1.600 | — | — | 1.600 | — | — | — | — | — | 0.000 |
| 33 | 14 | 27 | 41 | — | — | 1.600 | — | 1.600 | — | — | — | — | — | 0.000 |
| 34 | 15 | 28 | 43 | — | — | — | 1.700 | 1.700 | — | — | — | — | — | 0.000 |
| 35 | 19 | 19 | 38 | 0.800 | — | — | 0.900 | 1.700 | — | — | — | — | — | 0.000 |
| 36 | 20 | 22 | 42 | — | — | 0.800 | 0.800 | 1.600 | — | — | — | — | — | 0.000 |

TABLE 1-2

| | No. | Crystal orientation on wire surface Abundance ratio of crystal orientation having angular difference of 15 degrees or less from direction perpendicular to one place including wire center axis (%) | | | | | $<100> + <110> + <111>$ | Whether $X + Y > Z$ is satisfied? | Average crystal grain size in section perpendicular to wire center axis (um) | Crystal orientation in section in direction parallel to wire center axis Abundance ratio of crystal orientation having angular difference of 15 degree or less from wire center axis (%) | | |
|---|---|---|---|---|---|---|---|---|---|---|---|---|
| | | $<100>$:X | $<110>$:Y | $<111>$:Z | $<121>$ | $<123>$ | | | | $<111>$ | $<100>$ | Total |
| Examples | 37 | 13 | 18 | 7 | 4 | 7 | 38 | ○ | 1.0 | 19 | 25 | 44 |
| | 38 | 11 | 13 | 7 | 5 | 7 | 31 | ○ | 0.9 | 20 | 26 | 46 |
| | 39 | 10 | 14 | 7 | 6 | 6 | 31 | ○ | 1.2 | 16 | 28 | 44 |
| | 40 | 13 | 13 | 9 | 6 | 7 | 35 | ○ | 1.1 | 15 | 27 | 42 |
| | 41 | 14 | 11 | 7 | 5 | 5 | 32 | ○ | 1.3 | 18 | 28 | 46 |
| | 42 | 15 | 12 | 9 | 5 | 5 | 36 | ○ | 1.2 | 20 | 25 | 45 |
| | 43 | 7 | 14 | 8 | 4 | 5 | 29 | ○ | 1.1 | 13 | 24 | 37 |
| | 44 | 16 | 11 | 9 | 5 | 6 | 36 | ○ | 1.4 | 15 | 28 | 43 |
| | 45 | 14 | 18 | 10 | 6 | 4 | 42 | ○ | 1.5 | 17 | 22 | 39 |
| | 46 | 13 | 19 | 8 | 5 | 4 | 40 | ○ | 1.6 | 16 | 23 | 39 |
| | 47 | 14 | 15 | 9 | 4 | 3 | 38 | ○ | 1.5 | 15 | 22 | 37 |
| | 48 | 15 | 13 | 9 | 5 | 4 | 37 | ○ | 1.4 | 16 | 24 | 40 |
| | 49 | 14 | 15 | 9 | 4 | 3 | 38 | ○ | 1.2 | 17 | 23 | 40 |
| | 50 | 16 | 11 | 10 | 7 | 6 | 37 | ○ | 1.6 | 18 | 20 | 38 |
| | 51 | 14 | 20 | 10 | 5 | 6 | 44 | ○ | 1.4 | 19 | 22 | 41 |
| | 52 | 15 | 18 | 9 | 5 | 6 | 42 | ○ | 1.4 | 19 | 20 | 39 |
| | 53 | 16 | 17 | 9 | 6 | 5 | 42 | ○ | 1.5 | 18 | 22 | 40 |
| | 54 | 15 | 15 | 10 | 5 | 5 | 40 | ○ | 1.4 | 17 | 24 | 41 |
| | 55 | 16 | 17 | 9 | 8 | 8 | 42 | ○ | 1.2 | 19 | 20 | 39 |
| | 56 | 13 | 18 | 9 | 4 | 3 | 40 | ○ | 1.3 | 15 | 21 | 36 |
| | 57 | 11 | 15 | 11 | 5 | 3 | 37 | ○ | 1.6 | 18 | 22 | 40 |
| | 58 | 16 | 16 | 13 | 4 | 2 | 45 | ○ | 1.5 | 15 | 23 | 38 |
| | 59 | 10 | 12 | 15 | 5 | 5 | 37 | ○ | 1.6 | 16 | 22 | 38 |
| | 60 | 16 | 10 | 8 | 3 | 10 | 34 | ○ | 1.1 | 16 | 30 | 46 |
| | 61 | 19 | 14 | 7 | 5 | 7 | 40 | ○ | 1.0 | 15 | 33 | 48 |
| | 62 | 15 | 15 | 8 | 6 | 5 | 38 | ○ | 1.6 | 12 | 33 | 45 |
| | 63 | 18 | 12 | 6 | 10 | 6 | 36 | ○ | 1.5 | 15 | 26 | 41 |
| | 64 | 15 | 10 | 8 | 6 | 7 | 33 | ○ | 1.6 | 14 | 30 | 44 |
| | 65 | 17 | 13 | 7 | 5 | 5 | 37 | ○ | 2.0 | 16 | 30 | 46 |
| | 66 | 19 | 10 | 8 | 4 | 5 | 37 | ○ | 2.0 | 14 | 25 | 39 |
| | 67 | 15 | 16 | 7 | 4 | 5 | 38 | ○ | 1.6 | 11 | 33 | 44 |
| | 68 | 16 | 12 | 6 | 3 | 4 | 34 | ○ | 1.9 | 10 | 28 | 38 |

TABLE 1-2-continued

|   | 69 | 15 | 15 | 5 | 4 | 5 | 35 | ○ | 2.0 | 12 | 27 | 39 |
|---|---|---|---|---|---|---|---|---|---|---|---|---|
|   | 70 | 15 | 16 | 8 | 3 | 7 | 39 | ○ | 1.5 | 19 | 28 | 47 |

|  |  | Contents of elements (mass %) | | | | | Contents of elements (mass %) | | | | | |
|---|---|---|---|---|---|---|---|---|---|---|---|---|
|  | No. | Ni | Pd | Pt | Au | Total | P | In | Ga | Ge | Ag | Total |
| Examples | 37 | 0.400 | — | 0.800 | 0.400 | 1.600 | — | — | — | — | — | 0.0000 |
|  | 38 | 1.500 | — | — | — | 1.500 | — | — | — | — | — | 0.0000 |
|  | 39 | — | 1.500 | — | — | 1.500 | — | — | — | — | — | 0.0000 |
|  | 40 | — | — | 1.500 | — | 1.500 | — | — | — | — | — | 0.0000 |
|  | 41 | — | — | — | 1.500 | 1.500 | — | — | — | — | — | 0.0000 |
|  | 42 | 0.900 | — | — | 0.600 | 1.500 | — | — | — | — | — | 0.0000 |
|  | 43 | — | — | 0.700 | 0.800 | 1.500 | — | — | — | — | — | 0.0000 |
|  | 44 | — | 0.700 | 0.700 | 0.100 | 1.500 | — | — | — | — | — | 0.0000 |
|  | 45 | — | — | 0.500 | — | 0.500 | 0.0009 | — | — | — | — | 0.0090 |
|  | 46 | — | — | — | 0.100 | 0.100 | — | 0.0008 | — | — | — | 0.0008 |
|  | 47 | — | — | — | — | 0.000 | — | — | 0.0009 | — | — | 0.0009 |
|  | 48 | — | 0.500 | — | — | 0.500 | — | — | — | 0.0009 | — | 0.0009 |
|  | 49 | — | — | 0.400 | — | 0.400 | — | — | — | — | 0.0008 | 0.0008 |
|  | 50 | — | — | — | — | 0.000 | 0.0010 | — | — | — | — | 0.0010 |
|  | 51 | — | — | 0.200 | — | 0.200 | — | 0.0010 | — | — | — | 0.0010 |
|  | 52 | — | 0.300 | — | — | 0.300 | — | — | 0.0010 | — | — | 0.0010 |
|  | 53 | — | — | 0.200 | — | 0.200 | — | — | — | 0.0010 | — | 0.0010 |
|  | 54 | — | — | — | 0.100 | 0.100 | — | — | — | — | 0.0010 | 0.0010 |
|  | 55 | 0.800 | — | — | — | 0.800 | 0.7600 | — | — | — | — | 0.7600 |
|  | 56 | — | — | — | — | 0.000 | — | 0.7600 | — | — | — | 0.7600 |
|  | 57 | — | — | 0.100 | — | 0.100 | — | — | 0.7700 | — | — | 0.7700 |
|  | 58 | — | 0.200 | — | — | 0.200 | — | — | — | 0.7600 | — | 0.7600 |
|  | 59 | — | — | — | 0.300 | 0.300 | — | — | — | — | 0.7700 | 0.7700 |
|  | 60 | — | — | — | 0.050 | 0.050 | 0.7500 | — | — | — | — | 0.7500 |
|  | 61 | — | — | — | 0.020 | 0.020 | — | 0.7500 | — | — | — | 0.7500 |
|  | 62 | — | — | 0.010 | — | 0.010 | — | — | 0.7500 | — | — | 0.7500 |
|  | 63 | — | — | 0.010 | — | 0.010 | — | — | — | 0.7500 | — | 0.7500 |
|  | 64 | — | — | — | — | 0.000 | — | — | — | — | 0.7500 | 0.7500 |
|  | 65 | — | — | — | — | 0.000 | — | 0.4000 | 0.3000 | — | — | 0.7000 |
|  | 66 | — | — | — | — | 0.000 | — | — | 0.0050 | 0.2000 | — | 0.7000 |
|  | 67 | — | — | — | — | 0.000 | — | — | 0.0050 | 0.0200 | — | 0.5200 |
|  | 68 | — | — | — | — | 0.000 | — | — | 0.1000 | — | 0.0050 | 0.1500 |
|  | 69 | — | — | — | — | 0.000 | — | — | — | 0.3000 | 0.0050 | 0.3500 |
|  | 70 | — | — | — | — | 0.000 | 0.0050 | — | — | — | — | 0.0050 |

TABLE 1-3

|  |  | Crystal orientation on wire surface | | | | | | | Average crystal grain size in section perpendicular to wire center axis (um) | Crystal orientation in section in direction parallel to wire center axis Abundance ratio of crystal orientation having angular difference of 15 degree or less from wire center axis (%) | | |
|---|---|---|---|---|---|---|---|---|---|---|---|---|
|  |  | Abundance ratio of crystal orientation having angular difference of 15 degrees or less from direction perpendicular to one place including wire center axis (%) | | | | | <100> + <110> + <111> | Whether X + Y > Z is satisfied? |  | | | |
|  | No. | <100>:X | <110>:Y | <111>:Z | <121> | <123> |  |  |  | <111> | <100> | Total |
| Examples | 71 | 15 | 20 | 9 | 5 | 8 | 44 | ○ | 1.8 | 18 | 26 | 44 |
|  | 72 | 18 | 21 | 10 | 6 | 7 | 49 | ○ | 1.9 | 11 | 35 | 46 |
|  | 73 | 16 | 22 | 8 | 5 | 10 | 46 | ○ | 1.5 | 10 | 28 | 38 |
|  | 74 | 14 | 23 | 7 | 6 | 10 | 44 | ○ | 1.7 | 11 | 25 | 36 |
|  | 75 | 15 | 24 | 8 | 7 | 10 | 47 | ○ | 1.8 | 10 | 22 | 32 |
|  | 76 | 4 | 5 | 5 | 12 | 16 | 14 | ○ | 0.5 | 5 | 13 | 18 |
|  | 77 | 5 | 4 | 5 | 13 | 15 | 14 | ○ | 0.4 | 5 | 12 | 17 |
|  | 78 | 5 | 5 | 4 | 13 | 14 | 14 | ○ | 0.5 | 6 | 10 | 16 |
|  | 79 | 25 | 17 | 18 | 12 | 9 | 60 | ○ | 0.8 | 8 | 9 | 17 |
|  | 80 | 14 | 25 | 17 | 11 | 14 | 56 | ○ | 1.0 | 7 | 10 | 17 |
|  | 81 | 16 | 17 | 25 | 12 | 16 | 58 | ○ | 0.9 | 8 | 9 | 17 |
|  | 82 | 3 | 4 | 4 | 12 | 13 | 11 | ○ | 1.0 | 10 | 11 | 2 |
|  | 83 | 4 | 3 | 4 | 13 | 13 | 11 | ○ | 0.8 | 9 | 10 | 19 |
|  | 84 | 4 | 4 | 3 | 12 | 12 | 11 | ○ | 0.8 | 9 | 10 | 19 |
|  | 85 | 15 | 26 | 12 | 11 | 12 | 53 | ○ | 0.9 | 10 | 11 | 2 |
|  | 86 | 12 | 11 | 26 | 13 | 13 | 49 | × | 0.8 | 9 | 10 | 19 |
|  | 87 | 26 | 10 | 11 | 12 | 13 | 47 | ○ | 0.9 | 10 | 10 | 20 |

TABLE 1-3-continued

|  | | | | | | | | | | | | |
|---|---|---|---|---|---|---|---|---|---|---|---|---|
| Com- | 7 | 2 | 1 | 1 | 12 | 16 | 4 | ○ | 0.5 | 10 | 8 | 18 |
| para- | 8 | 1 | 2 | 1 | 13 | 13 | 4 | ○ | 0.6 | 9 | 7 | 16 |
| tive | 9 | 1 | 1 | 2 | 12 | 11 | 4 | ○ | 0.3 | 9 | 8 | 17 |
| exam- | 10 | 27 | 10 | 2 | 11 | 12 | 39 | ○ | 0.5 | 10 | 8 | 18 |
| ples | 11 | 3 | 27 | 11 | 11 | 12 | 41 | ○ | 0.4 | 8 | 8 | 16 |
|  | 12 | 15 | 15 | 27 | 13 | 11 | 57 | ○ | 0.3 | 10 | 9 | 19 |

|  | No. | Contents of elements (mass %) | | | | | Contents of elements (mass %) | | | | |
|---|---|---|---|---|---|---|---|---|---|---|---|
|  |  | Ni | Pd | Pt | Au | Total | P | In | Ga | Ge | Ag | Total |
| Exam- | 71 | — | — | 1.200 | — | 1.200 | — | — | — | — | — | 0.0000 |
| ples | 72 | — | — | 0.500 | — | 0.500 | — | — | — | — | 0.0500 | 0.0500 |
|  | 73 | — | — | — | 0.030 | 0.030 | — | — | 0.5000 | — | — | 0.0500 |
|  | 74 | — | — | 0.100 | — | 0.100 | — | 0.300 | — | — | 0.0200 | 0.3200 |
|  | 75 | — | — | — | — | 0.000 | — | — | — | — | — | 0.0000 |
|  | 76 | — | — | — | — | 0.000 | — | — | — | — | — | 0.0000 |
|  | 77 | — | — | — | — | 0.000 | — | — | — | — | — | 0.0000 |
|  | 78 | — | — | — | — | 0.000 | — | — | — | — | — | 0.0000 |
|  | 79 | — | — | — | — | 0.000 | — | — | — | — | — | 0.0000 |
|  | 80 | — | — | — | — | 0.000 | — | — | — | — | — | 0.0000 |
|  | 81 | — | — | — | — | 0.000 | — | — | — | — | — | 0.0000 |
|  | 82 | — | — | — | — | 0.000 | — | — | — | — | — | 0.0000 |
|  | 83 | — | — | — | — | 0.000 | — | — | — | — | — | 0.0000 |
|  | 84 | — | — | — | — | 0.000 | — | — | — | — | — | 0.0000 |
|  | 85 | — | — | — | — | 0.000 | — | — | — | — | — | 0.0000 |
|  | 86 | — | — | — | — | 0.000 | — | — | — | — | — | 0.0000 |
|  | 87 | — | — | — | — | 0.000 | — | — | — | — | — | 0.0000 |
| Com- | 7 | — | — | — | — | 0.000 | — | — | — | — | — | 0.0000 |
| para- | 8 | — | — | — | — | 0.000 | — | — | — | — | — | 0.0000 |
| tive | 9 | — | — | — | — | 0.000 | — | — | — | — | — | 0.0000 |
| exam- | 10 | — | — | — | — | 0.000 | — | — | — | — | — | 0.0000 |
| ples | 11 | — | — | — | — | 0.000 | — | — | — | — | — | 0.0000 |
|  | 12 | — | — | — | — | 0.000 | — | — | — | — | — | 0.0000 |

TABLE 2-1

| | No. | Evaluation result | | | | | |
|---|---|---|---|---|---|---|---|
| | | Straightness of loops | Straightness of loops after resin sealing | Damage of neck portion | Damage of neck portion under low loop | Ball bond area life in high-temperature storage test | Crimped ball shape |
| Exam- | 1 | 1 | 3 | 1 | 1 | 1 | 1 |
| ples | 2 | 1 | 1 | 2 | 1 | 1 | 1 |
| | 3 | 1 | 1 | 2 | 1 | 1 | 1 |
| | 4 | 1 | 2 | 2 | 1 | 1 | 1 |
| | 5 | 1 | 2 | 2 | 2 | 1 | 1 |
| | 6 | 1 | 3 | 2 | 2 | 1 | 1 |
| | 7 | 1 | 3 | 2 | 2 | 1 | 1 |
| | 8 | 1 | 4 | 2 | 2 | 1 | 1 |
| | 9 | 1 | 4 | 1 | 2 | 1 | 1 |
| | 10 | 1 | 4 | 2 | 2 | 1 | 1 |
| | 11 | 1 | 4 | 1 | 2 | 1 | 1 |
| | 12 | 1 | 4 | 2 | 2 | 1 | 1 |
| | 13 | 1 | 4 | 2 | 1 | 1 | 1 |
| | 14 | 1 | 4 | 2 | 2 | 1 | 1 |
| | 15 | 1 | 3 | 2 | 1 | 1 | 1 |
| | 16 | 1 | 3 | 2 | 2 | 1 | 1 |
| | 17 | 1 | 4 | 2 | 2 | 1 | 1 |
| | 18 | 1 | 4 | 2 | 2 | 1 | 1 |
| | 19 | 1 | 4 | 2 | 2 | 1 | 1 |
| | 20 | 1 | 4 | 2 | 2 | 1 | 1 |
| | 21 | 1 | 4 | 2 | 2 | 1 | 1 |
| | 22 | 1 | 4 | 2 | 2 | 1 | 1 |
| | 23 | 1 | 4 | 2 | 2 | 1 | 1 |
| | 24 | 1 | 4 | 2 | 2 | 2 | 1 |
| | 25 | 1 | 4 | 2 | 2 | 2 | 1 |
| | 26 | 1 | 4 | 2 | 2 | 2 | 1 |
| | 27 | 1 | 4 | 2 | 2 | 2 | 1 |
| | 28 | 1 | 1 | 2 | 2 | 2 | 1 |
| | 29 | 1 | 4 | 2 | 2 | 2 | 1 |
| | 30 | 1 | 4 | 2 | 2 | 2 | 1 |
| | 31 | 1 | 4 | 2 | 2 | 1 | 1 |
| | 32 | 1 | 4 | 2 | 2 | 1 | 1 |

TABLE 2-1-continued

| | No. | Straightness of loops | Straightness of loops after resin sealing | Damage of neck portion | Damage of neck portion under low loop | Ball bond area life in high-temperature storage test | Crimped ball shape |
|---|---|---|---|---|---|---|---|
| | 33 | 1 | 4 | 2 | 2 | 1 | 1 |
| | 34 | 1 | 4 | 2 | 2 | 1 | 1 |
| | 35 | 1 | 4 | 2 | 2 | 1 | 1 |
| | 36 | 1 | 4 | 2 | 2 | 1 | 1 |
| | 37 | 1 | 4 | 2 | 2 | 1 | 1 |
| | 38 | 1 | 4 | 2 | 2 | 2 | 1 |
| | 39 | 1 | 4 | 2 | 2 | 2 | 1 |
| | 40 | 1 | 4 | 2 | 2 | 2 | 1 |
| | 41 | 1 | 4 | 2 | 2 | 2 | 1 |
| | 42 | 1 | 4 | 2 | 2 | 2 | 1 |

TABLE 2-2

| | No. | Straightness of loops | Straightness of loops after resin sealing | Damage of neck portion | Damage of neck portion under low loop | Ball bond area life in high-temperature storage test | Crimped ball shape |
|---|---|---|---|---|---|---|---|
| Examples | 43 | 1 | 4 | 2 | 2 | 2 | 1 |
| | 44 | 1 | 4 | 2 | 2 | 2 | 1 |
| | 45 | 1 | 4 | 2 | 2 | 2 | 1 |
| | 46 | 1 | 4 | 2 | 2 | 2 | 1 |
| | 47 | 1 | 4 | 2 | 2 | 1 | 1 |
| | 48 | 1 | 4 | 2 | 2 | 2 | 1 |
| | 49 | 1 | 4 | 2 | 2 | 2 | 1 |
| | 50 | 1 | 4 | 2 | 2 | 1 | 2 |
| | 51 | 1 | 4 | 2 | 2 | 2 | 2 |
| | 52 | 1 | 4 | 2 | 2 | 2 | 2 |
| | 53 | 1 | 4 | 2 | 2 | 2 | 2 |
| | 54 | 1 | 4 | 2 | 2 | 2 | 2 |
| | 55 | 1 | 4 | 2 | 2 | 2 | 1 |
| | 56 | 1 | 4 | 2 | 2 | 1 | 1 |
| | 57 | 1 | 4 | 2 | 2 | 2 | 1 |
| | 58 | 1 | 4 | 2 | 2 | 2 | 1 |
| | 59 | 1 | 4 | 2 | 2 | 2 | 1 |
| | 60 | 1 | 4 | 2 | 2 | 2 | 2 |
| | 61 | 1 | 4 | 2 | 2 | 2 | 2 |
| | 62 | 1 | 4 | 2 | 2 | 2 | 2 |
| | 63 | 1 | 4 | 2 | 2 | 2 | 2 |
| | 64 | 1 | 4 | 2 | 2 | 1 | 2 |
| | 65 | 1 | 4 | 2 | 2 | 1 | 2 |
| | 66 | 1 | 4 | 2 | 2 | 1 | 2 |
| | 67 | 1 | 4 | 2 | 2 | 1 | 2 |
| | 68 | 1 | 4 | 2 | 2 | 1 | 2 |
| | 69 | 1 | 4 | 2 | 2 | 1 | 2 |
| | 70 | 1 | 4 | 2 | 2 | 1 | 2 |
| | 71 | 1 | 4 | 2 | 2 | 2 | 1 |
| | 72 | 1 | 4 | 2 | 2 | 2 | 2 |
| | 73 | 1 | 4 | 2 | 2 | 2 | 2 |
| | 74 | 1 | 4 | 2 | 2 | 2 | 2 |
| | 75 | 1 | 4 | 2 | 2 | 1 | 1 |

TABLE 2-3

| | No. | Straightness of loops | Straightness of loops after resin sealing | Damage of neck portion | Damage of neck portion under low loop | Ball bond area life in high-temperature storage test | Crimped ball shape |
|---|---|---|---|---|---|---|---|
| Examples | 76 | 0 | 0 | 2 | 1 | 1 | 1 |
| | 77 | 0 | 0 | 2 | 1 | 1 | 1 |
| | 78 | 0 | 0 | 2 | 1 | 1 | 1 |
| | 79 | 0 | 0 | 2 | 1 | 1 | 1 |

TABLE 2-3-continued

| | | Evaluation result | | | | | |
|---|---|---|---|---|---|---|---|
| | No. | Straightness of loops | Straightness of loops after resin sealing | Damage of neck portion | Damage of neck portion under low loop | Ball bond area life in high-temperature storage test | Crimped ball shape |
| | 80 | 0 | 0 | 2 | 1 | 1 | 1 |
| | 81 | 0 | 0 | 2 | 1 | 1 | 1 |
| | 82 | 0 | 0 | 2 | 1 | 1 | 1 |
| | 83 | 0 | 0 | 2 | 1 | 1 | 1 |
| | 84 | 0 | 0 | 2 | 1 | 1 | 1 |
| | 85 | 0 | 0 | 2 | 1 | 1 | 1 |
| | 86 | 0 | 0 | 2 | 1 | 1 | 1 |
| | 87 | 0 | 0 | 2 | 1 | 1 | 1 |
| Comparative examples | 7 | −1 | −1 | 2 | 1 | 1 | 1 |
| | 8 | −1 | −1 | 2 | 1 | 1 | 1 |
| | 9 | −1 | −1 | 1 | 1 | 1 | 1 |
| | 10 | −1 | −1 | 2 | 1 | 1 | 1 |
| | 11 | −1 | −1 | 2 | 1 | 1 | 1 |
| | 12 | −1 | −1 | 1 | 1 | 1 | 1 |

The invention claimed is:

1. A Cu alloy bonding wire for a semiconductor device, wherein each of abundance ratios of crystal orientations <100>, <110> and <111> having an angular difference of 15 degrees or less from a direction perpendicular to one plane including a wire center axis out of crystal orientations on a wire surface is 3% or more and less than 27% in average area percentage.

2. The Cu alloy bonding wire for a semiconductor device according to claim 1, wherein a total of the abundance ratios of the crystal orientations <100>, <110> and <111> having the angular difference of 15 degrees or less from the direction perpendicular to one plane including the wire center axis out of the crystal orientations on the wire surface is 15% or more and less than 50% in average area percentage.

3. The Cu alloy bonding wire for a semiconductor device according to claim 2, wherein when the abundance ratios of the crystal orientations <100>, <110> and <111> having the angular difference of 15 degrees or less from the direction perpendicular to one plane including the wire center axis out of the crystal orientations on the wire surface are represented by X, Y and Z respectively, X+Y>Z is satisfied.

4. The Cu alloy bonding wire for a semiconductor device according to claim 3, wherein each of abundance ratios of crystal orientations <121> and <123> having an angular difference of 15 degrees or less from a direction perpendicular to one plane including the wire center axis out of the crystal orientations on the wire surface is less than 15% in average area percentage.

5. The Cu alloy bonding wire for a semiconductor device according to claim 1, wherein an average crystal grain size in a section perpendicular to the wire center axis is 0.4 µm or more and 2.1 µm or less.

6. The Cu alloy bonding wire for a semiconductor device according to claim 1, wherein a total of abundance ratios of crystal orientations <111> and <100> having an angular difference of 15 degrees or less from the wire center axis out of crystal orientations in a section in a direction parallel to the wire center axis is 25% or more and less than 60% in average area percentage.

7. The Cu alloy bonding wire for a semiconductor device according to claim 1, wherein the Cu alloy bonding wire contains one or more of Ni, Pd, Pt and Au for a total of 0.01 mass % or more and 1.5 mass % or less and a balance is Cu and incidental impurities.

8. The Cu alloy bonding wire for a semiconductor device according to claim 1, wherein the Cu alloy bonding wire contains one or more of P, In, Ga, Ge, and Ag for a total of 0.001 mass % or more and 0.75 mass % or less and a balance is Cu and incidental impurities.

* * * * *